(12) United States Patent
Kjellman

(10) Patent No.: US 12,615,046 B2
(45) Date of Patent: Apr. 28, 2026

(54) SYSTEM AND METHOD FOR VERIFYING OPERATIONAL INTEGRITY OF A CONTROL HEAD MONITOR

(71) Applicant: Kidde-Fenwal, LLC, Ashland, MA (US)

(72) Inventor: Thomas Kjellman, Uxbridge, MA (US)

(73) Assignee: Kidde-Fenwal, LLC, Ashland, MA (US)

( * ) Notice: Subject to any disclaimer, the term of this patent is extended or adjusted under 35 U.S.C. 154(b) by 125 days.

(21) Appl. No.: 18/763,633

(22) Filed: Jul. 3, 2024

(65) Prior Publication Data

US 2025/0047280 A1     Feb. 6, 2025

Related U.S. Application Data

(60) Provisional application No. 63/517,889, filed on Aug. 4, 2023.

(51) Int. Cl.
*H03K 17/693*     (2006.01)
*H01P 1/15*     (2006.01)
*H03K 17/76*     (2006.01)

(52) U.S. Cl.
CPC ............. *H03K 17/693* (2013.01); *H01P 1/15* (2013.01); *H03K 17/76* (2013.01)

(58) Field of Classification Search
CPC .... A62C 37/50; G01R 31/3277; G01R 31/50; H01P 1/15; H03K 17/18; H03K 17/693; H03K 17/76
See application file for complete search history.

(56) References Cited

U.S. PATENT DOCUMENTS

| | | | | |
|---|---|---|---|---|
| 2004/0222702 A1* | 11/2004 | Yin | .................. | H01H 9/167 |
| | | | | 307/134 |
| 2012/0274153 A1* | 11/2012 | Maxwell | ............... | H02J 7/0036 |
| | | | | 307/126 |
| 2013/0214922 A1* | 8/2013 | Clarke | ................. | G01R 19/155 |
| | | | | 324/501 |
| 2025/0350272 A1* | 11/2025 | Bianchi | ............ | H03K 3/356017 |

* cited by examiner

*Primary Examiner* — Omer S Khan
(74) *Attorney, Agent, or Firm* — Honigman, LLP

(57)     ABSTRACT
A control head monitor including a single pole double throw (SPDT) switch, is disclosed. The SPDT switch includes a first terminal, a second terminal, a third terminal, and a switching element. The load element is connected between an input line and the second terminal. The input line of a detection circuit is connected to the first terminal and an output line of the detection circuit is connected to the third terminal. The switching element is adapted to connect the first terminal and the third terminal during an OFF mode. The switching element is adapted to connect the second terminal and the third terminal, to generate at least one of an output signal and an absence of an output signal.

12 Claims, 4 Drawing Sheets

203

| 203A "ON" | 203B "OFF" | 203C |
|-----------|------------|------|
| Trouble | Trouble | 1 |
| Trouble | Trouble | 2 |
| Trouble | Trouble | 3 |
| Trouble | Trouble | 4 |
| Trouble | Trouble | 5 |
| Trouble | Supervisory | 6 |
| Trouble | Supervisory | 7 |
| Trouble | Supervisory | 8 |
| Trouble | Supervisory | 9 |
| Trouble | Supervisory | 10 |
| Trouble | Supervisory | 11 |
| Trouble | Supervisory | 12 |
| Trouble | Supervisory | 13 |
| Trouble | Supervisory | 14 |
| Trouble | Trouble | 15 |
| Ok | Trouble | 16 |
| Ok | Trouble | 17 |
| Ok | Trouble | 18 |
| Ok | Trouble | 19 |
| Ok | Trouble | 20 |

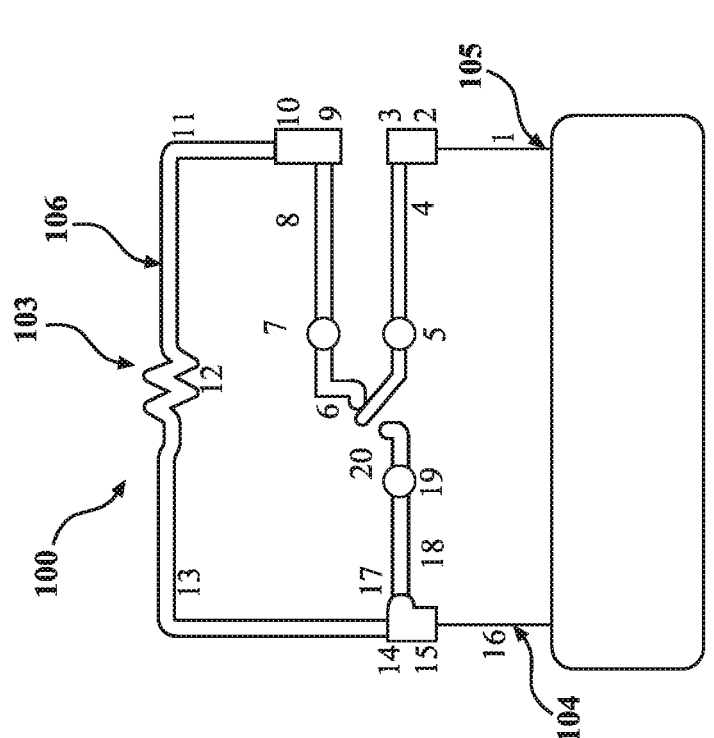

SYSTEM AND METHOD FOR VERIFYING OPERATIONAL INTEGRITY OF A CONTROL HEAD MONITOR

CROSS REFERENCE TO A RELATED APPLICATION

The application claims the benefit of U.S. Provisional Application No. 63/517,889 filed Aug. 4, 2023, the contents of which are hereby incorporated in their entirety.

FIELD OF THE INVENTION

The disclosure generally relates to control head monitors. More particularly, the disclosure relates to a system and a method for verifying operational integrity of the control head monitor.

BACKGROUND

Control Head Monitors (CHMs) are typically installed onto a supervisory circuit monitored for integrity by an end of line resistor. Compromised integrity in the supervisory circuit can be differentiated from a supervisory alert as the difference between a signal indicating a broken circuit in comparison to a signal indicating a short circuit. However, there are internal wires within the housing of the CHMs in which breakage is not differentiable from an open-switch system. An improved detection method and system for determining operational integrity of the control head monitor is therefore desirable.

SUMMARY

This summary is provided to introduce a selection of concepts in a simplified format that are further described in the detailed description of the disclosure. This summary is not intended to identify key or essential inventive concepts of the disclosure, nor is it intended for determining the scope of the disclosure.

Disclosed herein is a control head monitor including a single pole double throw (SPDT) switch having a first terminal, a second terminal, a third terminal, and a switching element. A load element is connected between an input line and the second terminal. The input line of a detection circuit is connected to the first terminal and an output line of the detection circuit is connected to the third terminal. The switching element is adapted, during an OFF mode, to connect the first terminal and the third terminal. During an ON mode, the switching element is adapted to connect the second terminal and the third terminal to generate at least one of an output signal and an absence of an output signal.

In one or more embodiments according to the disclosure, the load element is at least one of a resistor, a diode, an inductor, and a capacitor.

In one or more embodiments according to the disclosure, the load element is connected on a bypassing line between the input line and the second terminal.

A system for verifying operational integrity of a control head monitor, is also disclosed. The system includes the control head monitor having a single pole double throw (SPDT) switch with a first terminal, a second terminal, a third terminal, and a switching element. The load element is connected between an input line and the second terminal. The input line of a detection circuit is connected to the first terminal and an output line of the detection circuit is connected to the third terminal. The switching element is adapted, during an OFF mode, to connect the first terminal and the third terminal. The switching element is adapted, during an ON mode, to connect the second terminal and the third terminal, to generate at least one of an output signal and an absence of an output signal. The detection circuit includes at least one controller coupled to the input line and the output line. The at least one controller is adapted to receive at least one of the generated output signal and the absence of the output signal during the OFF mode and the ON mode of the control head monitor. Then, the at least one controller verifies the operational integrity of the control head monitor based on the received at least one of the output signal and the absence of the output signal during the OFF mode and the ON mode of the control head monitor.

In one or more embodiments according to the disclosure, verifying the operational integrity of the control head monitor includes comparing at least one of the generated output signal and the absence of the output signal received during the ON mode with at least one of the generated output signal and the absence of the output signal received during the OFF mode. Next, the input line, the output line, and a bypassing line through the load element is identified as in an undamaged state based on the compared at least one of the generated output signal and the absence of the output signal during the ON mode and the OFF mode.

In one or more embodiments according to the disclosure, verifying the operational integrity of the control head monitor includes comparing at least one of the generated output signal and the absence of the output signal received during the ON mode with at least one of the generated output signal and the absence of the output signal received during the OFF mode. Next, at least one of a portion of the input line, a portion of the output line, and a portion of a bypassing line through the load element as in a damaged state based on the compared at least one of the generated output signal and the absence of the output signal during the ON mode and the OFF mode.

In one or more embodiments according to the disclosure, the controller is adapted to generate a first notification based on the input line, the output line, and the bypassing line through the load element being identified as in the undamaged state. The controller generates a second notification based on at least one of a portion of the input line, a portion of the output line, and a portion of a bypassing line through the load element being identified as in the damaged state.

In one or more embodiments according to the disclosure, the first notification and the second notification are at least one of a visual notification, an audio notification, an audio visual notification, and a haptic notification.

In one or more embodiments according to the disclosure, the load element is at least one of a resistor, a diode, an inductor, and a capacitor.

In one or more embodiments according to the disclosure, the load element is connected on a bypassing line between the input line and the second terminal.

A method for verifying operational integrity of a control head monitor is disclosed. The method includes providing the control head monitor including a single pole double throw (SPDT) switch having a first terminal, a second terminal, a third terminal, and a switching element. A load element is connected between an input line and the second terminal. The input line of a detection circuit is connected to the first terminal and an output line of the detection circuit connected to the third terminal. The switching element is adapted, during an OFF mode, to connect the first terminal and the third terminal. During an ON mode, the switching element connects the second terminal and the third terminal.

During the ON mode and the OFF mode, at least one of an output signal and an absence of an output signal is generated. At least one controller of a detection circuit receives at least one of the generated output signal and the absence of the output signal during the OFF mode and the ON mode of the control head monitor. The at least one controller verifies the operational integrity of the control head monitor based on the received at least one of the output signal and the absence of the output signal during the OFF mode and the ON mode of the control head monitor.

In one or more embodiments according to the disclosure, verifying the operational integrity of the control head monitor includes comparing at least one of the generated output signal and the absence of the output signal received during the ON mode with at least one of the generated output signal and the absence of the output signal received during the OFF mode. Next, the input line, the output line, and a bypassing line through the load element is identified as in an undamaged state based on the compared at least one of the generated output signal and the absence of the output signal during the ON mode and the OFF mode.

In one or more embodiments according to the disclosure, verifying the operational integrity of the control head monitor includes comparing at least one of the generated output signal and the absence of the output signal received during the ON mode with at least one of the generated output signal and the absence of the output signal received during the OFF mode. Next, at least one of a portion of the input line, a portion of the output line, and a portion of a bypassing line through the load element is identified as in a damaged state based on the compared at least one of the generated output signal and the absence of the output signal during the ON mode and the OFF mode.

In one or more embodiments according to the disclosure, the controller is adapted to generate a first notification based on the input line, the output line, and the bypassing line through the load element being identified as in the undamaged state. Alternatively, the controller is adapted to generate a second notification based on at least one of a portion of the input line, a portion of the output line, and a portion of the bypassing line through the load element being identified as in the damaged state.

In one or more embodiments according to the disclosure, the first notification and the second notification are at least one of a visual notification, an audio notification, an audio visual notification, and a haptic notification.

To further clarify the advantages and features of the method and system, a more particular description of the method and system will be rendered by reference to specific embodiments thereof, which is illustrated in the appended drawing. It is appreciated that these drawings depict only typical embodiments of the disclosure and are therefore not to be considered limiting its scope. The disclosure will be described and explained with additional specificity and detail with the accompanying drawings.

BRIEF DESCRIPTION OF THE DRAWINGS

These and other features, aspects, and advantages will become better understood when the following detailed description is read with reference to the accompanying drawings in which like characters represent like parts throughout the drawings, wherein:

FIG. 2B illustrates a set of sample output signals generated by the system for verifying operational integrity of the control head monitor.

Figure 1B:
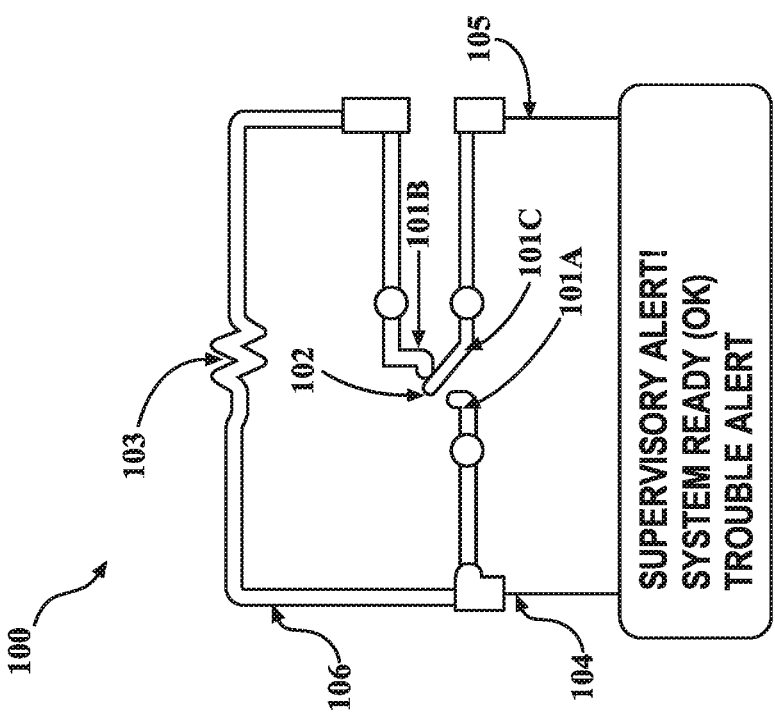
FIG. 1B illustrates a circuit diagram representation of the control head monitor.

Further, skilled artisans will appreciate that elements in the drawings are illustrated for simplicity and may not have necessarily been drawn to scale. For example, the flow charts illustrate the method in terms of the most prominent steps involved to help to improve understanding of aspects of the disclosure. Furthermore, in terms of the construction of the device, one or more components of the device may have been represented in the drawings by conventional symbols, and the drawings may show only those specific details that are pertinent to understanding the embodiments of the disclosure so as not to obscure the drawings with details that will be readily apparent to those of ordinary skill in the art having the benefit of the description herein.

DETAILED DESCRIPTION

For the purpose of promoting an understanding of the principles of the disclosure, reference will now be made to the various embodiments and specific language will be used to describe the same. It will nevertheless be understood that no limitation of the scope of the disclosure is thereby intended, such alterations and further modifications in the illustrated system, and such further applications of the principles of the disclosure as illustrated therein being contemplated as would normally occur to one skilled in the art to which the disclosure relates.

It will be understood by those skilled in the art that the foregoing general description and the following detailed description are explanatory of the disclosure and are not intended to be restrictive thereof.

Reference throughout this specification to "an aspect", "another aspect" or similar language means that a particular feature, structure, or characteristic described in connection with the embodiment is included in at least one embodiment of the disclosure. Thus, appearances of the phrase "in an embodiment", "in another embodiment", "some embodiments", "one or more embodiments" and similar language throughout this specification may, but do not necessarily, all refer to the same embodiment.

The terms "comprises", "comprising", or any other variations thereof, are intended to cover a non-exclusive inclusion, such that a process or method that comprises a list of steps does not include only those steps but may include other steps not expressly listed or inherent to such process or method. Similarly, one or more devices or sub-systems or elements or structures or components proceeded by "comprises . . . a" does not, without more constraints, preclude the existence of other devices or other sub-systems or other elements or other structures or other components or additional devices or additional sub-systems or additional elements or additional structures or additional components.

Embodiments of the disclosure will be described below in detail with reference to the accompanying drawings.

Figure 1A:
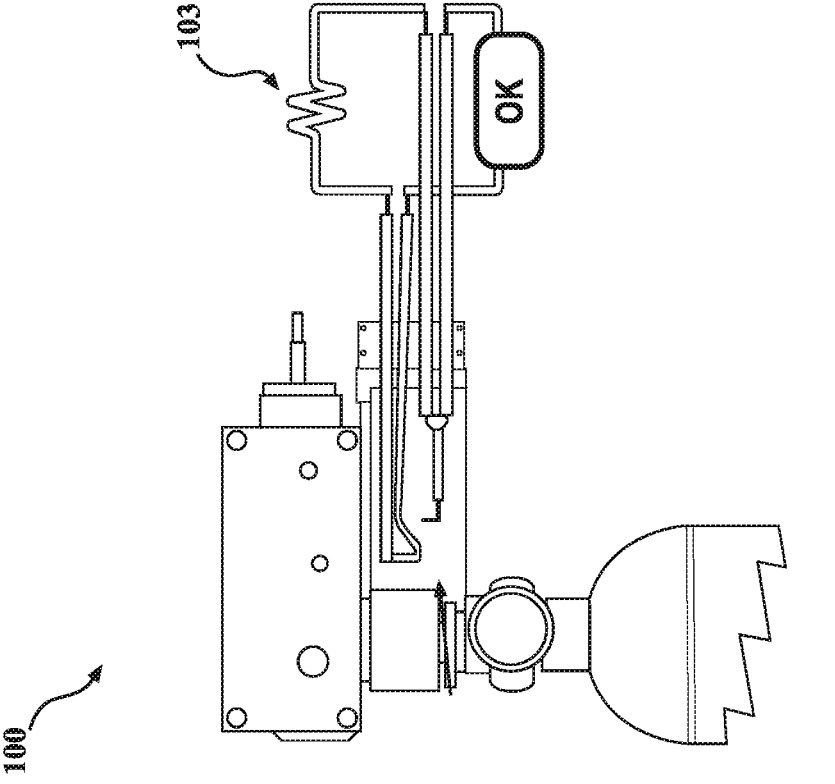
FIG. 1A illustrates a schematic representation of a control head monitor.

FIG. 1A illustrates a schematic representation of a control head monitor 100. FIG. 1B illustrates a circuit diagram representation of the control head monitor 100. The control head monitor 100 includes a single pole double throw (SPDT) switch 101 having a first terminal 101a, a second terminal 101b, a third terminal 101c, and a switching element 102. A load element 103 is connected between an input line 104 and the second terminal 101*b*. More particularly, the load element 103 is connected on a bypassing line 106 between the input line 104 and the second terminal 101*b*. In an embodiment, the load element 103 is at least one of a resistor, a diode, an inductor, and a capacitor.

It may be appreciated that although the load element 103 may be assumed to be a resistor, a diode, an inductor, or a combination of the same; any circuit element may be used instead that, when engaged or included as part of the monitored circuit would cause the signal output to be recognizably different from either the open circuit condition or the condition when the circuit element in question is bypassed by a "short circuit" condition. For example, with the use of the typical resistor arrangement, a high or infinite resistance may be possible when the circuit is open/incomplete, a medium or specific resistance (e.g., 10 ohms for a 10 ohm resistor) may be possible when the resistor is an engaged part of the closed circuit, or a low or zero resistance may be possible when the circuit has a completed path that bypasses the resistor. Therefore, if another load element can be used to produce the medium or specific resistance, which would contrast with the open or shorted conditions, then this switch arrangement would also be useful in theory as the arrangement facilitates a switching between those three possible output conditions.

The input line 104 of a detection circuit is connected to the first terminal 101*a* and an output line 105 of the detection circuit is connected to the third terminal 101*c*. During an OFF mode, the switching element 102 is adapted to connect the first terminal 101*a* and the third terminal 101*c*. Since the first terminal 101*a* and the third terminal 101*c* are connected, an input signal supplied through the input line 104 is transmitted through the output line 105 as an output signal. The input signal may be supplied to the SPDT switch 101 to determine if internal wiring of the control head monitor 100 is unbroken or not damaged.

As used herein, an "ON mode" of the control head monitor 100 refers to a state in which the control head monitor 100 is installed and the "OFF mode" of the control head monitor 100 refers to the state in which the control head monitor is uninstalled or dismantled.

During the ON mode, the switching element 102 is adapted to connect the second terminal 101*b* and the third terminal 101*c*. Since the second terminal 101*b* and the third terminal 101*c* are connected, an input signal supplied through the input line 104 is transmitted to the output line 105 through the load element 103 on the bypassing line 106 as the output signal. Therefore, during both the OFF mode and the ON mode of the control head monitor 100, the input signal supplied must generate the output signal if there are no breakages or damage to the internal wires of the control head monitor 100.

However, if internal breakages or damage to the wiring exist, an absence of the output signal is generated. During both the OFF mode and during the ON mode at least one of an output signal or an absence of the output signal is generated. Therefore, by using the detection circuit, the output signal or the absence of the output signal may be detected to determine if a notification or alert must be generated to notify security personnel.

Figure 2A:
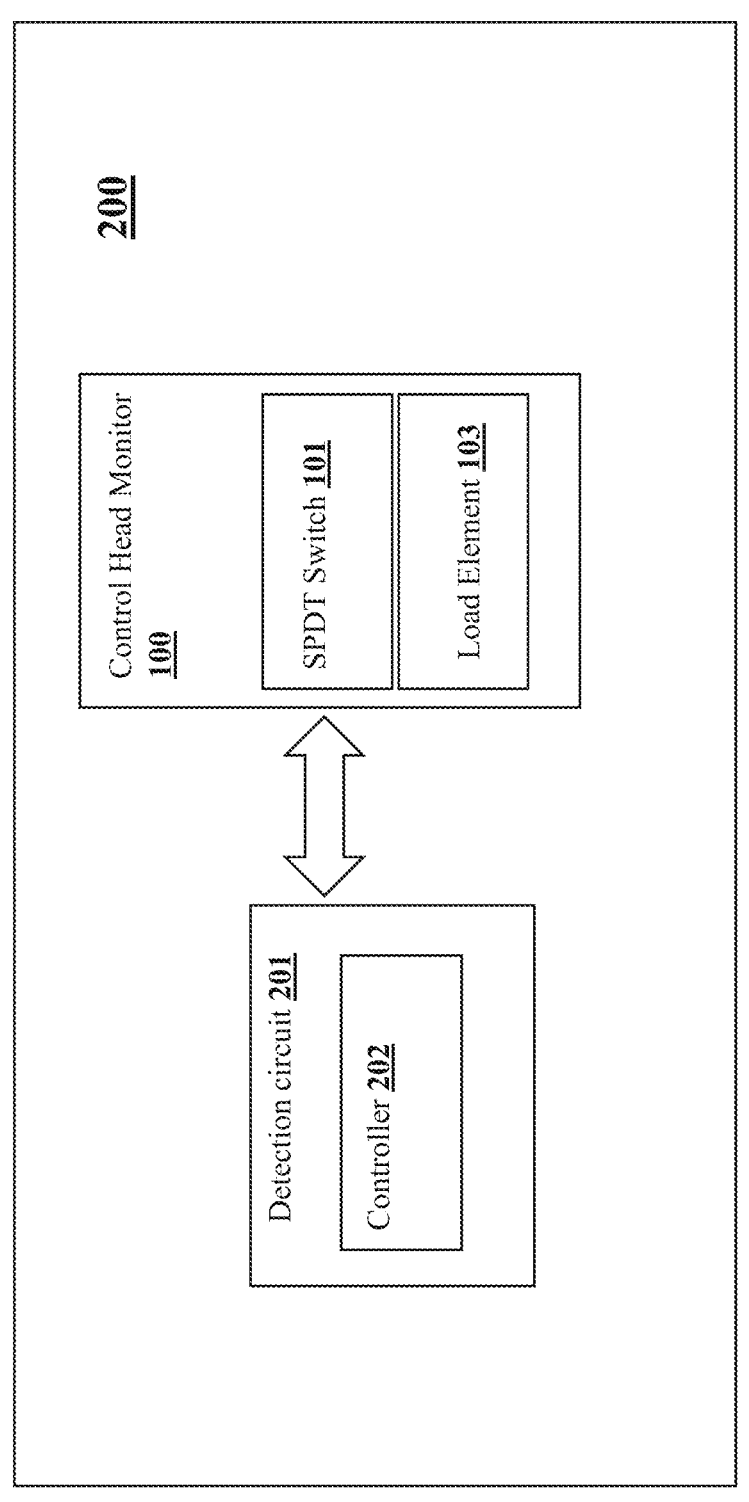
FIG. 2A illustrates a block diagram representation of a system for verifying operational integrity of the control head monitor.

FIG. 2A illustrates a block diagram representation of a system 200 for verifying operational integrity of the control head monitor 100. The system 200 includes the control head monitor 100 having the single pole double throw (SPDT) switch 101 with the first terminal 101*a*, the second terminal 101*b*, the third terminal 101*c*, and the switching element

102. The load element 103 is connected between the input line 104 and the second terminal 101*b*. The input line 104 of the detection circuit is connected to the first terminal 101*a* and the output line 105 of the detection circuit is connected to the third terminal 101*c* as shown in FIG. 1B. The detection circuit 201 includes at least one controller 202 coupled to the input line 104 and the output line 105.

More particularly, the at least one controller 202 is connected to the SPDT switch 101 and the load element 103 through the input line 104 and the output line 105. The at least one controller 202 is adapted to receive at least one of the generated output signal and the absence of the output signal during the OFF mode and the ON mode of the control head monitor 100. This means that the at least one controller 202 is adapted to receive the generated output signal or the absence of the output signal during both the OFF mode and the ON mode separately. The at least one controller 202 verifies the operational integrity of the control head monitor 100 based on the received at least one of the output signal and the absence of the output signal during the OFF mode and the ON mode of the control head monitor 100. This means if there is an absence of the output signal during the OFF mode and/or the ON mode, the at least one controller 202 determines the operational integrity as being compromised. Alternatively, if the output signal is generated for both the OFF mode and the ON mode separately, then the at least one controller 202 verifies the operational integrity of the control head monitor 100.

As used herein, the term "operational integrity" refers to a normal functioning or intended state of functioning of the control head monitor 100 disclosed herein. With prolonged use, over the years, the individual components, such as the internal wires, the supply lines, terminals, etc., are prone to wear or damage. This prevents the control head monitor 100 from functioning as intended or designed. Consequently, the operational integrity of the system 200 is compromised. Therefore, periodic inspection to ascertain the operational integrity or system readiness is desirable.

As used herein, the term "at least one controller 202", may be construed to encompass one or a combination of microprocessors, suitable logic, circuits, printed circuit boards (PCB), audio interfaces, visual interfaces, haptic interfaces, or the like. The at least one controller 202 may include, but are not limited to a microcontroller, a Reduced Instruction Set Computing (RISC) processor, an Application-Specific Integrated Circuit (ASIC) processor, a Complex Instruction Set Computing (CISC) processor, a central processing unit (CPU), a graphics processing unit (GPU), a state machine, and/or other processing units or circuits.

The at least one controller 202 may also comprise suitable logic, circuits, interfaces, and/or code that may be configured to execute a set of instructions stored in a memory unit. In an exemplary implementation, the memory unit may include, but is not limited to, Electrically Erasable Programmable Read-only Memory (EEPROM), Random Access Memory (RAM), Read Only Memory (ROM), Hard Disk Drive (HDD), Flash memory, Solid-State Drive (SSD), and/or CPU cache memory.

In an exemplary embodiment, the at least one controller 202 may receive power from a suitably coupled power source. For example, the suitably coupled power source may be electrically coupled to the at least one controller 202 for supplying electrical power. In an embodiment, the power source may be, for example, a battery, such as a rechargeable battery or a non-rechargeable battery. Examples of suitable batteries include, for example, a lithium battery (such as a lithium-ion battery), a nickel battery (such as a nickel-cadmium battery), and an alkaline battery.

FIG. 2B illustrates a set of sample output signals generated by the system 200 shown in FIG. 2A for verifying operational integrity of the control head monitor 100. The step of verifying the operational integrity of the control head monitor 100 includes firstly, comparing at least one of the generated output signal or the absence of the output signal received during the ON mode with at least one of the generated output signal or the absence of the output signal received during the OFF mode. Next, the input line (104), the output line (105), and the bypassing line (106) through the load element (103) are identified as in an undamaged state based on the compared at least one of the generated output signal and the absence of the output signal during the ON mode and the OFF mode. This means that during the ON mode and the OFF mode of the control head monitor 100, the output signal is generated or detected by the detection circuit 201 at the output line 105 to be identified as in the undamaged state. If the output signal is absent during either the ON mode and/or the OFF mode of the control head monitor 100, the input line 104, the output line 105, and the bypassing line 106 cannot be identified as in the undamaged state. The controller 202 is adapted to generate a first notification based on the input line 104, the output line 105, and the bypassing line 106 through the load element 103 being identified as in the undamaged state. The first notification may be at least one of a visual notification, an audio notification, an audio visual notification, and a haptic notification. For example, the first notification may be visual notification such as "SYSTEM READY", "SYSTEM OK", etc.

The step of verifying the operational integrity of the control head monitor 100 may include firstly, comparing at least one of the generated output signal or the absence of the output signal received during the ON mode with at least one of the generated output signal or the absence of the output signal received during the OFF mode. Next, at least one of a portion of the input line 104, a portion the output line 105, and/or a portion of the bypassing line 106 through the load element 103 are identified as in a damaged state based on the compared at least one of the generated output signal and the absence of the output signal during the ON mode and/or the OFF mode. This means that during the ON mode and/or the OFF mode of the control head monitor 100, the output signal is absent or undetected by the detection circuit 201 at the output line 105 to be identified as in the damaged state. If the output signal is absent during either the ON mode and/or the OFF mode of the control head monitor 100, at least a portion of the input line 104, a portion of the output line 105, and/or a portion of the bypassing line 106 may be identified as in the damaged state. The controller 202 is adapted to generate a second notification based on at least one of a portion of the input line 104, a portion of the output line 105, and a portion of the bypassing line 106 through the load element 103 being identified as in the damaged state. The second notification may be at least one of a visual notification, an audio notification, an audio visual notification, and a haptic notification. For example, the second notification may be visual notification such as "SYSTEM MALFUNCTION", "TROUBLE", "ALERT", "TROUBLE", "SUPERVISORY ALERT", etc.

The system 200 is also adapted to identify specific portions (15, 16, 17, 18, 19, 20) of the input line 104, specific portions (1, 2, 3, 4, 5) of the output line 105, and/or specific portions (6, 7, 8, 9, 10, 11, 12, 13, 14) of the bypassing line 106 as being in the damaged state. This is exemplarily illustrated by a sample table 203. Column 203a of the table 203 represents the second notification during the ON mode and Column 203b represents the second notification during the OFF mode. By comparing the generated second notifications during the ON mode and the OFF mode, the controller 202 may determine the specific portions (15, 16, 17, 18, 19, 20) of the input line 104, the specific portions (1, 2, 3, 4, 5) of the output line 105, and/or the specific portions (6, 7, 8, 9, 10, 11, 12, 13, 14) of the bypassing line 106 as being in the damaged state.

For example, if specific portions (1, 2, 3, 4, 5) of the output line 105 are damaged, no output signal is detected by the detection circuit 201 at the output line 105 during the ON mode and the OFF mode. Therefore, the second notification "TROUBLE" is displayed during both the ON mode and the OFF mode. As such, if the second notification "TROUBLE" is generated during both the ON mode and the OFF mode, an inspection or maintenance personnel can quickly identify that at least one of the specific portions (1, 2, 3, 4, 5) are damaged. This features ensures quick identification and solution of the problem.

In another scenario, if specific portions (6, 7, 8, 9, 10, 11, 12, 13, 14) of the bypassing line 106 are damaged, no output signal is detected by the detection circuit 201 at the output line 105 during the ON mode. During the OFF mode, the output signal is detected at the output line 105. As such, if the second notification "TROUBLE" is generated during the ON mode and the second notification "SUPERVISORY" is generated during the OFF mode, the inspection or maintenance personnel can quickly identify that at least one of the specific portions (6, 7, 8, 9, 10, 11, 12, 13, 14) of the bypassing line 106 are damaged. In an embodiment, "SUPERVISORY" alert may be generated when the panel sees a short circuit which does not have the specified resistance (resistance is closer to zero), while "TROUBLE" alert may be generated when the loop is broken (resistance is effectively infinite). This features ensures quick identification and solution of the problem.

Similarly, if the specific portions (15, 16, 17, 18, 19, 20) of the input line 104 are damaged, the second notification "TROUBLE" is generated during the OFF mode. As such, if the second notification "OK" is generated during the ON mode and the second notification "TROUBLE" is generated during the OFF mode, the inspection or maintenance personnel can quickly identify that at least one of the specific portions (17, 18, 19, 20) is damaged. On the other hand, if the second notification "TROUBLE" is generated during the ON mode and the second notification "TROUBLE" is generated during the OFF mode, the inspection or maintenance personnel can quickly identify that at least one of the specific portions (15, 16) is damaged.

Figure 3:
FIG. 3 illustrates a flowchart indicating a method for verifying operational integrity of the control head monitor.
Figure 3:
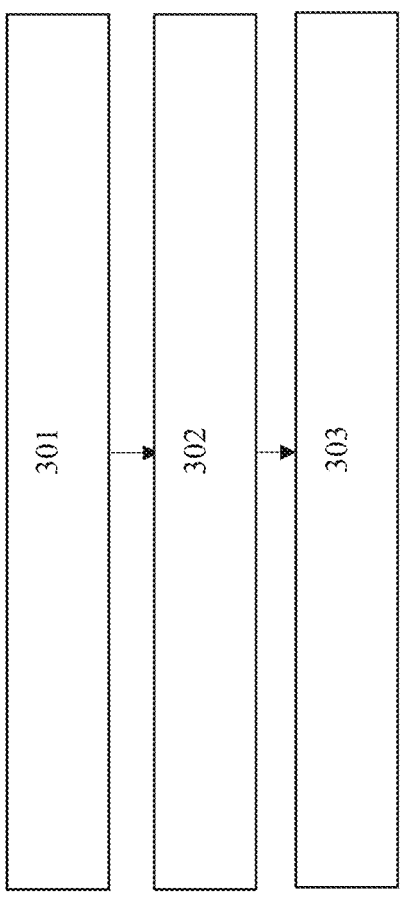

FIG. 3 illustrates a flowchart indicating a method 300 for verifying operational integrity of the control head monitor. For the sake of brevity, details of the present disclosure that are explained in the description of FIGS. 1A-2B are not explained in the description of FIG. 3.

The method 300 for verifying operational integrity of the control head monitor 100 is disclosed. The method 300 includes, at Step 301, providing the control head monitor 100 including the single pole double throw switch (SPDT) 101 having the first terminal 101a, the second terminal 101b, the third terminal 101c, and the switching element 102, the load element 103 is connected between the input line 104 and the second terminal 101b. The input line 104 of the detection circuit is connected to the first terminal 101a and the output line 105 of the detection circuit is connected to the third terminal 101c. The switching element 102 is adapted, during an OFF mode, to connect the first terminal 101*a* and the third terminal 101*c*. The switching element 102 is adapted, during an ON mode, to connect the second terminal 101*b* and the third terminal 101*c*, to generate at least one of the output signal and the absence of the output signal.

At Step 302, the at least one controller 202 of the detection circuit 201 receives at least one of the generated output signal and the absence of the output signal during the OFF mode and the ON mode of the control head monitor 100.

At Step 303, the at least one controller 202 verifies the operational integrity of the control head monitor 100 based on the received at least one of the output signal and the absence of the output signal during the OFF mode and the ON mode of the control head monitor 100.

Since the control head monitor 100 utilizes the SPDT switch 101, complex modification of existing control head monitors 100 or existing systems are eliminated. The system 200 allows easy monitoring and diagnosis of potential damage or breakages of the internal wires or wiring of the control head monitor 100.

As discussed in the detailed descriptions of FIGS. 1A-2B, by analyzing the output signals or the absence of the output signals at the output line 105, the controller 202 may determine the specific portions (15, 16, 17, 18, 19, 20) of the input line 104, the specific portions (1, 2, 3, 4, 5) of the output line 105, and/or the specific portions (6, 7, 8, 9, 10, 11, 12, 13, 14) of the bypassing line 106 as being in the damaged state. This allows maintenance or inspecting personnel to quickly identify the problem associated with the control head monitor 100 thereby ensuring quick resolution and reduced downtime.

As would be apparent to a person in the art, various working modifications may be made to the method in order to implement the inventive concept as taught herein.

Moreover, the actions of any flow diagram need not be implemented in the order shown; nor do all the acts necessarily need to be performed. Also, those acts that are not dependent on other acts may be performed in parallel with the other acts.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein.

Benefits, other advantages, and solutions to problems have been described above regarding specific embodiments. However, the benefits, advantages, solutions to problems, and any component(s) that may cause any benefit, advantage, or solution to occur or become more pronounced are not to be construed as a critical, or essential feature or component of any or all the claims.

What is claimed is:

1. A system for verifying operational integrity of a control head monitor, the system comprising:
   the control head monitor comprising:
      a single pole double throw switch (SPDT) having:
      a first terminal;
      a second terminal;
      a third terminal; and
      a switching element;
      a load element; and a detection circuit having an input line and an output line, wherein the input line is connected to the first terminal and the output line is connected to the third terminal, and the load element is connected between the input line and the second terminal;
   wherein the switching element is adapted:
      during an OFF mode, to connect the first terminal and the third terminal, and
      during an ON mode, to connect the second terminal and the third terminal, to generate at least one of an output signal and an absence of an output signal; and
   the detection circuit comprising at least one controller coupled to the input line and the output line, the at least one controller adapted to:
   receive at least one of the generated output signal and the absence of the output signal during the OFF mode and the ON mode of the control head monitor; and
   verify the operational integrity of the control head monitor based on the received at least one of the output signal and the absence of the output signal during the OFF mode and the ON mode of the control head monitor; and
   wherein verifying the operational integrity of the control head monitor includes:
   comparing at least one of the generated output signal and the absence of the output signal received during the ON mode with at least one of the generated output signal and the absence of the output signal received during the OFF mode; and
   identifying the input line, the output line, and a bypassing line through the load element as in an undamaged state based on the compared at least one of the generated output signal and the absence of the output signal during the ON mode and the OFF mode.

2. The system of claim 1, wherein verifying the operational integrity of the control head monitor comprises:
   comparing at least one of the generated output signal and the absence of the output signal received during the ON mode with at least one of the generated output signal and the absence of the output signal received during the OFF mode; and
   identifying at least one of a portion of the input line, a portion of the output line, and a portion of a bypassing line through the load element as in a damaged state based on the compared at least one of the generated output signal and the absence of the output signal during the ON mode and the OFF mode.

3. The system of claim 1, wherein the controller is adapted to generate:
   a first notification based on the input line, the output line, and the bypassing line through the load element being identified as in the undamaged state; and
   a second notification based on at least one of a portion of the input line, a portion of the output line, and a portion of the bypassing line through the load element being identified as in the damaged state.

4. The system of claim 3, wherein the first notification and the second notification are at least one of a visual notification, an audio notification, an audio visual notification, and a haptic notification.

5. The system of claim 1, wherein the load element is at least one of a resistor, a diode, an inductor, and a capacitor.

6. The system of claim 1, wherein the load element is connected on a bypassing line between the input line and the second terminal.

7. A method for verifying operational integrity of a control head monitor, the method comprising:

providing the control head monitor comprising:

a single pole double throw switch (SPDT) having:

a first terminal;

a second terminal;

a third terminal; and a switching element;

a load element connected between an input line and the second terminal; and the input line of a detection circuit connected to the first terminal and an output line of the detection circuit connected to the third terminal, wherein the switching element is adapted:

during an OFF mode, to connect the first terminal and the third terminal, and during an ON mode, to connect the second terminal and the third terminal, to generate at least one of an output signal and an absence of an output signal;

receiving, via at least one controller of a detection circuit, at least one of the generated output signal and the absence of the output signal during the OFF mode and the ON mode of the control head monitor;

verifying, via the at least one controller, the operational integrity of the control head monitor based on the received at least one of the output signal and the absence of the output signal during the OFF mode and the ON mode of the control head monitor; and wherein verifying the operational integrity of the control head monitor comprises:

comparing at least one of the generated output signal and the absence of the output signal received during the ON mode with at least one of the generated output signal and the absence of the output signal received during the OFF mode; and identifying the input line, the output line, and a bypassing line through the load element as in an undamaged state based on the compared at least one of the generated output signal and the absence of the output signal during the ON mode and the OFF mode.

8. The method of claim 7, wherein verifying the operational integrity of the control head monitor comprises:

comparing at least one of the generated output signal and the absence of the output signal received during the ON mode with at least one of the generated output signal and the absence of the output signal received during the OFF mode; and identifying at least one of a portion of the input line, a portion of the output line, and a portion of a bypassing line through the load element as in a damaged state based on the compared at least one of the generated output signal and the absence of the output signal during the ON mode and the OFF mode.

9. The method of claim 7, wherein the controller is adapted to generate:

a first notification based on the input line, the output line, and the bypassing line through the load element being identified as in the undamaged state; and a second notification based on at least one of a portion of the input line, a portion of the output line, and a portion of the bypassing line through the load element being identified as in the damaged state.

10. The method of claim 9, wherein the first notification and the second notification are at least one of a visual notification, an audio notification, an audio visual notification, and a haptic notification.

11. A system for verifying operational integrity of a control head monitor, the system comprising:

the control head monitor comprising:

a single pole double throw switch (SPDT) having:

a first terminal;

a second terminal;

a third terminal; and a switching element;

a load element; and a detection circuit having an input line and an output line, wherein the input line is connected to the first terminal and the output line is connected to the third terminal, and the load element is connected between the input line and the second terminal;

wherein the switching element is adapted:

during an OFF mode, to connect the first terminal and the third terminal, and during an ON mode, to connect the second terminal and the third terminal, to generate at least one of an output signal and an absence of an output signal; and the detection circuit comprising at least one controller coupled to the input line and the output line, the at least one controller adapted to:

receive at least one of the generated output signal and the absence of the output signal during the OFF mode and the ON mode of the control head monitor; and verify the operational integrity of the control head monitor based on the received at least one of the output signal and the absence of the output signal during the OFF mode and the ON mode of the control head monitor, wherein verifying the operational integrity of the control head monitor comprises:

comparing at least one of the generated output signal and the absence of the output signal received during the ON mode with at least one of the generated output signal and the absence of the output signal received during the OFF mode; and identifying at least one of a portion of the input line, a portion of the output line, and a portion of a bypassing line through the load element as in a damaged state based on the compared at least one of the generated output signal and the absence of the output signal during the ON mode and the OFF mode.

12. A method for verifying operational integrity of a control head monitor, the method comprising:

providing the control head monitor comprising:

a single pole double throw switch (SPDT) having:

a first terminal;

a second terminal;

a third terminal; and a switching element;

a load element connected between an input line and the second terminal; and the input line of a detection circuit connected to the first terminal and an output line of the detection circuit connected to the third terminal, wherein the switching element is adapted:

during an OFF mode, to connect the first terminal and the third terminal, and during an ON mode, to connect the second terminal and the third terminal, to generate at least one of an output signal and an absence of an output signal;

receiving, via at least one controller of a detection circuit, at least one of the generated output signal and the absence of the output signal during the OFF mode and the ON mode of the control head monitor;

verifying, via the at least one controller, the operational integrity of the control head monitor based on the received at least one of the output signal and the absence of the output signal during the OFF mode and the ON mode of the control head monitor, wherein verifying the operational integrity of the control head monitor comprises:

comparing at least one of the generated output signal and the absence of the output signal received during the ON mode with at least one of the generated output signal and the absence of the output signal received during the OFF mode; and identifying at least one of a portion of the input line, a portion of the output line, and a portion of a bypassing line through the load element as in a damaged state based on the compared at least one of the generated output signal and the absence of the output signal during the ON mode and the OFF mode.

* * * * *